(12) United States Patent
Graf et al.

(10) Patent No.: US 10,304,763 B2
(45) Date of Patent: May 28, 2019

(54) PRODUCING WAFER LEVEL PACKAGING USING LEADFRAME STRIP AND RELATED DEVICE

(71) Applicant: GLOBALFOUNDRIES Inc., Grand Cayman (KY)

(72) Inventors: Richard S. Graf, Gray, ME (US); Sudeep Mandal, Bangalore (IN); Kibby Horsford, Essex Jct., VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/858,673

(22) Filed: Dec. 29, 2017

(65) Prior Publication Data

US 2018/0122730 A1 May 3, 2018

Related U.S. Application Data

(62) Division of application No. 15/175,290, filed on Jun. 7, 2016, now Pat. No. 9,892,999.

(51) Int. Cl.
*H01L 23/495* (2006.01)
*H01L 21/48* (2006.01)
(Continued)

(52) U.S. Cl.
CPC ...... *H01L 23/49575* (2013.01); *H01L 21/486* (2013.01); *H01L 21/561* (2013.01); *H01L 21/565* (2013.01); *H01L 23/3128* (2013.01); *H01L 23/49541* (2013.01); *H01L 23/49579* (2013.01); *H01L 23/49586* (2013.01); *H01L 23/49816* (2013.01); *H01L 23/49861* (2013.01); *H01L 23/49866* (2013.01);
(Continued)

(58) Field of Classification Search
None
See application file for complete search history.

(56) References Cited

U.S. PATENT DOCUMENTS 6,184,575 B1 * 2/2001 Chillara .............. H01L 23/3121
257/666
8,659,146 B2 2/2014 Bauer et al.
(Continued)

FOREIGN PATENT DOCUMENTS

TW 201603221 A 1/2016

OTHER PUBLICATIONS

Yole Developpement, "Semi Networking Day Packaging—Key for System Integration", 2013, retrieved on Nov. 1, 2017 from http://www.semi.org/eu/sites/semi.org/files/docs/5_Yole_Nanium%20Workshop.pdf, 34 Pages.
(Continued)

*Primary Examiner* — Khaja Ahmad
(74) *Attorney, Agent, or Firm* — Ditthavong & Steiner, P.C.

(57) ABSTRACT

A method for producing wafer level packaging using an embedded leadframe strip and the resulting device are provided. Embodiments include placing dies into a mold with an active side of each die facing a surface of the mold; placing a leadframe strip on the mold, wherein the leadframe strip includes etched and half etched portions positioned between each die; placing a mold cover over the mold and dies; and adding mold compound in spaces between the dies and mold cover.

20 Claims, 8 Drawing Sheets

(51) Int. Cl.
*H01L 21/56* (2006.01)
*H01L 23/00* (2006.01)
*H01L 25/065* (2006.01)
*H01L 23/31* (2006.01)
*H01L 23/498* (2006.01)
*H01L 23/538* (2006.01)
*H01L 25/10* (2006.01)

(52) U.S. Cl.
CPC .......... *H01L 23/5389* (2013.01); *H01L 24/11* (2013.01); *H01L 24/14* (2013.01); *H01L 24/19* (2013.01); *H01L 24/96* (2013.01); *H01L 25/0652* (2013.01); *H01L 25/105* (2013.01); *H01L 2224/04105* (2013.01); *H01L 2224/12105* (2013.01); *H01L 2224/24175* (2013.01); *H01L 2225/1035* (2013.01); *H01L 2225/1041* (2013.01); *H01L 2225/1058* (2013.01); *H01L 2225/1094* (2013.01); *H01L 2924/15311* (2013.01)

(56) References Cited

U.S. PATENT DOCUMENTS

| | | |
|---|---|---|
| 2010/0133682 A1 | 6/2010 | Meyer |
| 2010/0144101 A1 | 6/2010 | Chow et al. |
| 2011/0127661 A1 | 6/2011 | Camacho et al. |
| 2013/0043572 A1 | 2/2013 | Williams et al. |
| 2013/0105991 A1 | 5/2013 | Gan et al. |
| 2013/0200528 A1 | 8/2013 | Lin et al. |
| 2014/0077352 A1 | 3/2014 | Leal et al. |
| 2014/0127858 A1* | 5/2014 | Shim, II ............... H01L 21/561 438/107 |
| 2015/0041859 A1* | 2/2015 | Otremba ........... H01L 23/49503 257/194 |
| 2015/0262981 A1* | 9/2015 | Yap ....................... H01L 25/165 361/760 |
| 2015/0364373 A1 | 12/2015 | Okamoto et al. |
| 2016/0005626 A1* | 1/2016 | van Gemert ........ H01L 21/4825 257/676 |
| 2016/0148894 A1* | 5/2016 | Zhu ........................ C09J 163/10 257/746 |

OTHER PUBLICATIONS

Nishio, "3D Package Technologies Review with Gap Analysis for Mobile Application Requirements", STATSChipPAC, Apr. 22, 2014 retrieved on Nov. 1, 2017 from http://thor.inemi.org/webdownload/2014/Substrate_Pkg_WS_Apr/09_STATSChipPAC.pdf, 25 Pages.
Office Action for related Taiwanese Patent Application No. 106104872, dated Jan. 24, 2018, 13 pages.

* cited by examiner

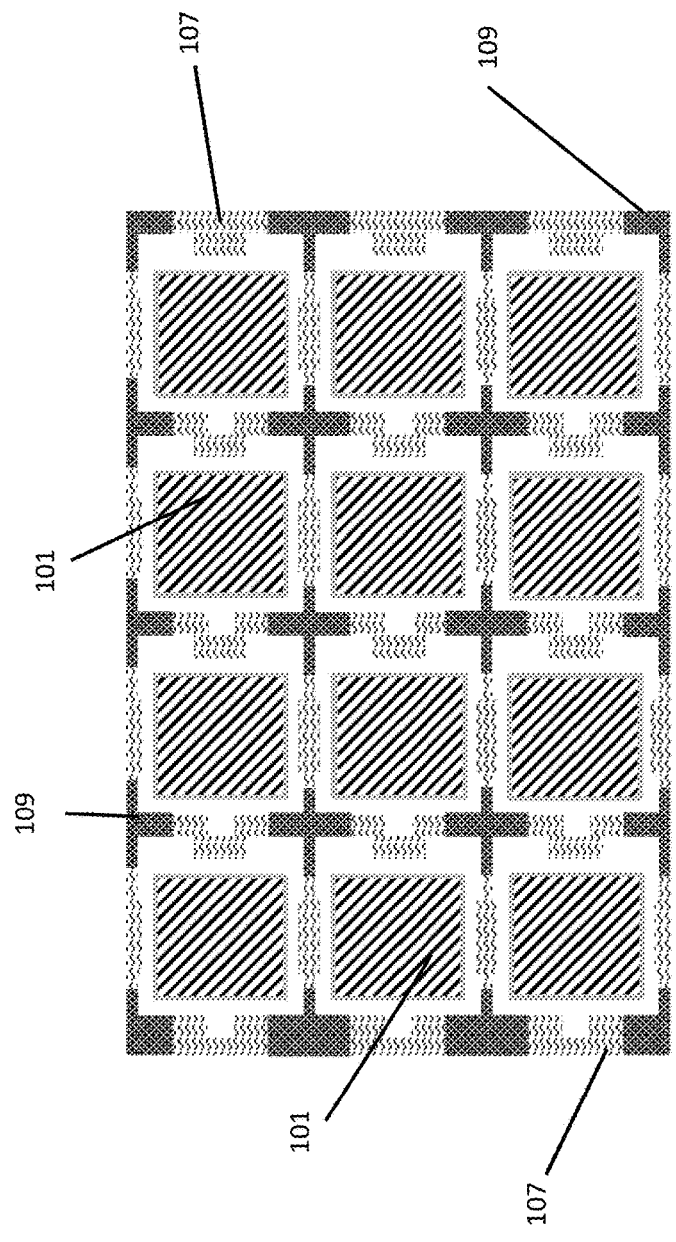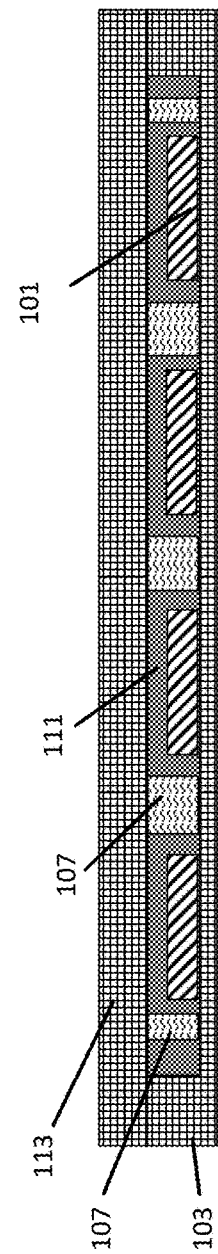
FIG. 1C
FIG. 1D

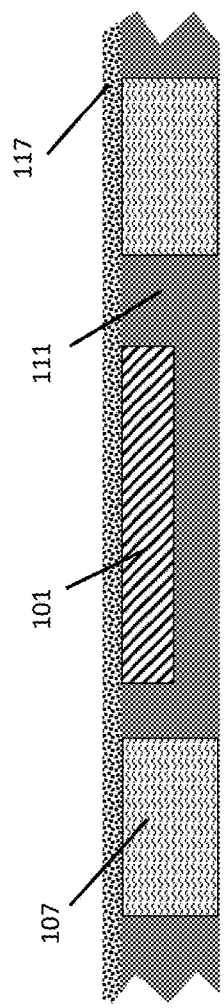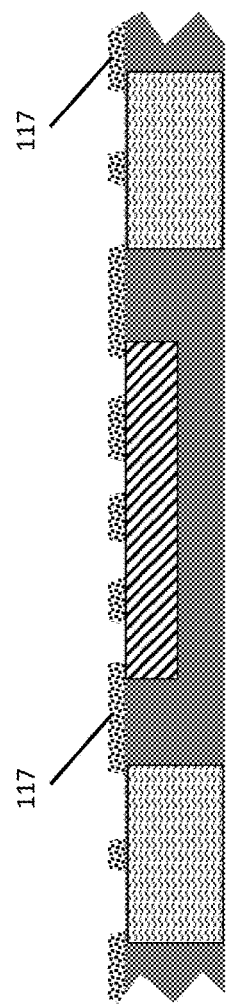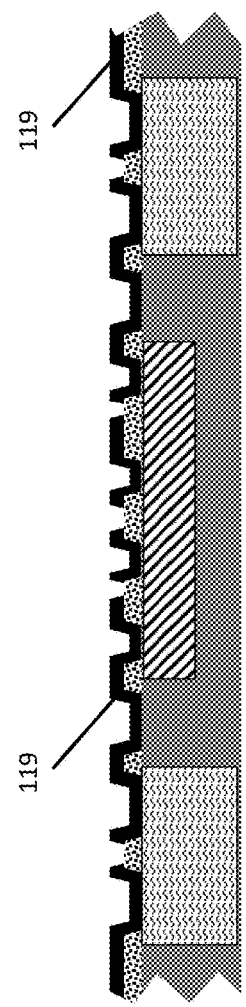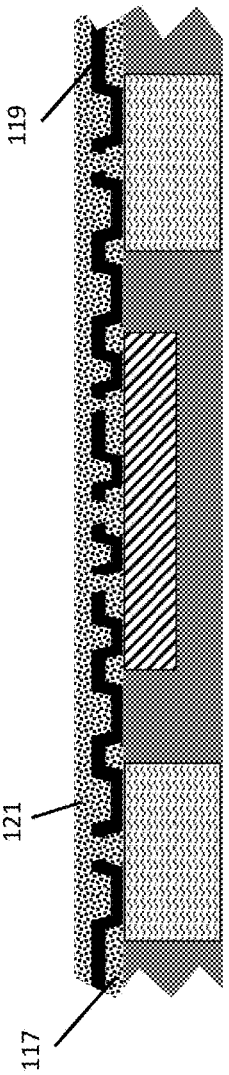

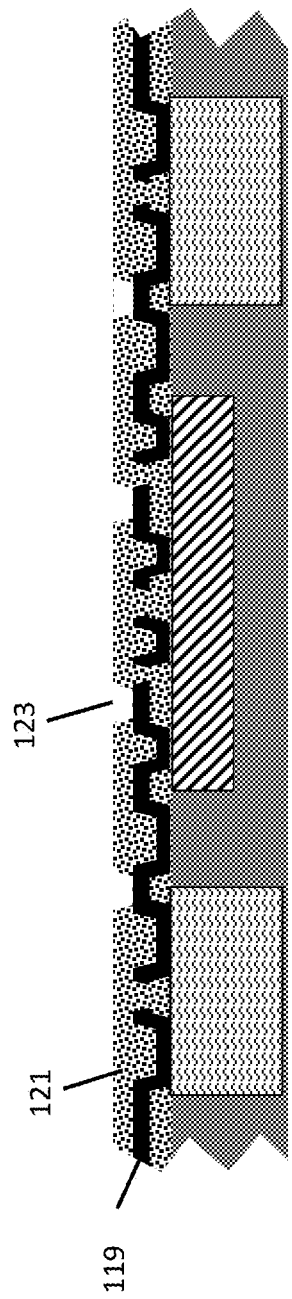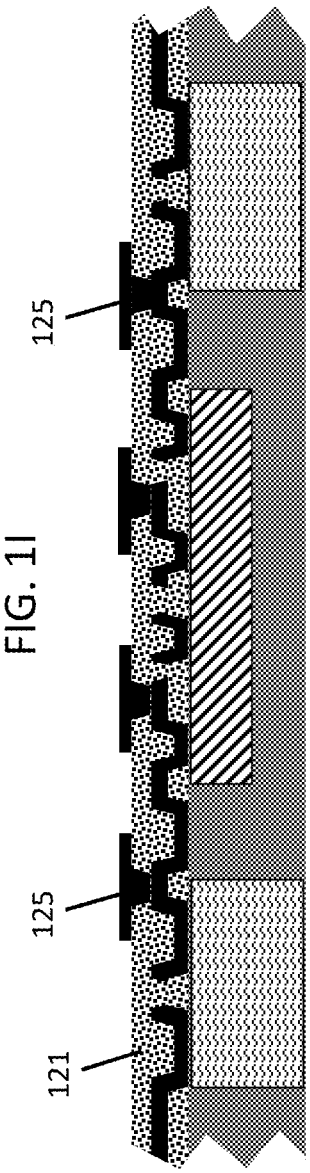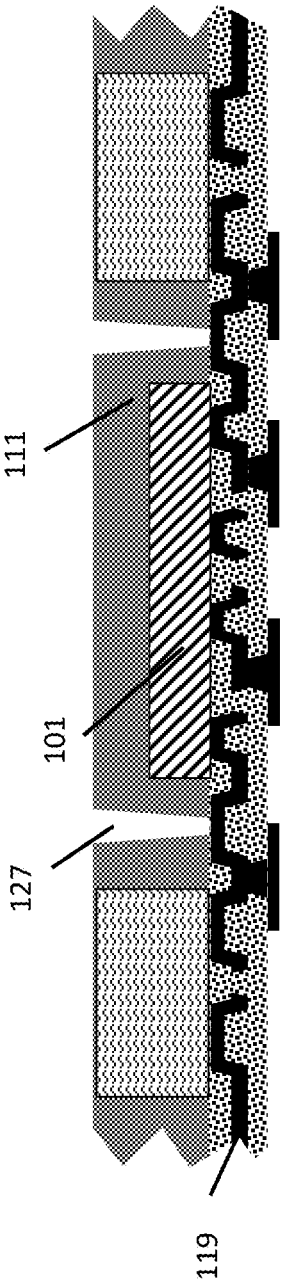

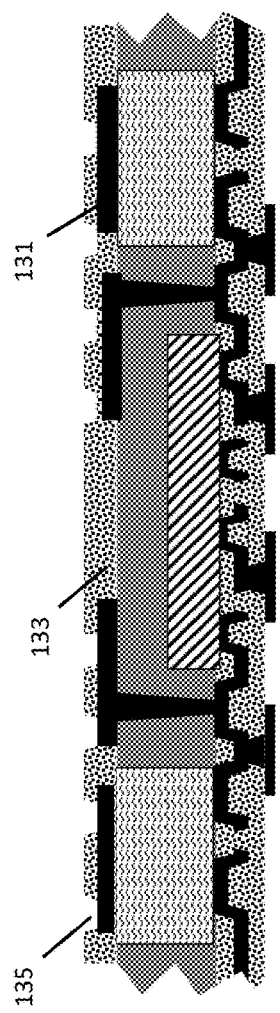
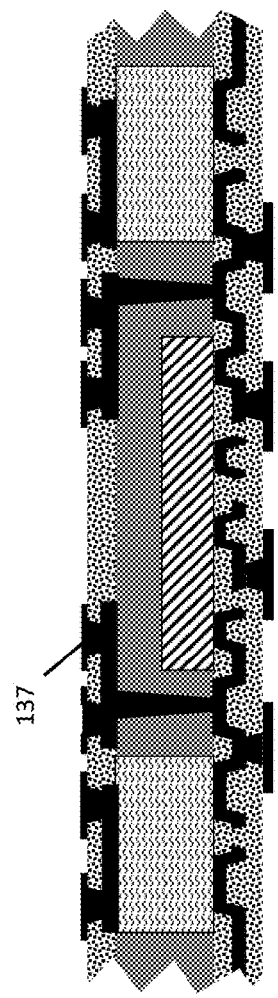
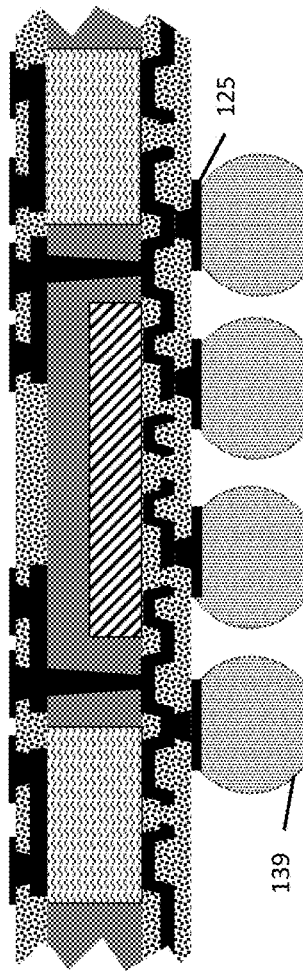

PRODUCING WAFER LEVEL PACKAGING USING LEADFRAME STRIP AND RELATED DEVICE

RELATED APPLICATION

The present application is a Divisional of application Ser. No. 15/175,290, filed on Jun. 7, 2016, which is incorporated herein by reference in its entirety.

TECHNICAL FIELD

The present disclosure relates to semiconductor packaging. In particular, the present disclosure relates to multichip wafer level packaging.

BACKGROUND

Three dimensional wafer level chip scale packaging (3D-WLCSP) is a technology in development that has potential for significant benefits in the mobile and radio frequency (RF) fields. However, there is a poor heat transfer path from the chips or packages mounted on top of the fan out WLCSP package to the printed circuit board (PCB), which is the primary heat transfer path for mobile applications due to the absence of airflow and restrictions of heat sinks.

Conventional processes have attempted to address heat transfer problems. With some processes, an electrically insulating material is placed around a chip and encapsulated in a mold compound. The electrical vias are formed in the electrically insulating material instead of the mold compound. Other processes utilize a leadframe based wirebond assembly, with exposed heat spreader pins that extend from the bottom side of the package. Wire bonding is required for input/output (I/O). Additional processes utilize leadframe based flip chip assembly with a heat spreader providing a direct thermal path from a center to an exposed bottom package surface. Other processes utilize through mold vias (TMV) between chips stacked on top and the PCB. However, these conventional processes do not provide sufficient thermal transfer pathways.

A need therefore exists for methodology enabling improved thermal transfer between top packages and the PCB and the resulting device.

SUMMARY

An aspect of the present disclosure is a method of providing an embedded leadframe strip which provides improved thermal transfer between top packages and the PCB.

Another aspect of the present disclosure is a device including an embedded leadframe strip which provides improved thermal transfer between top packages and the PCB.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including placing dies into a mold with an active side of each die facing a surface of the mold; placing a leadframe strip on the mold, wherein the leadframe strip includes etched and half etched portions positioned between each die; placing a mold cover over the mold and dies; and adding mold compound in spaces between the dies and mold cover.

Aspects of the present disclosure include flipping the mold over 180 degrees; and curing the mold compound, wherein the leadframe strip including copper or copper coated with a protective coating. Other aspects include removing the cured mold compound containing the dies from the mold and mold cover. Additional aspects include forming a first polymer layer on a non-active side of the dies; and curing the polymer layer. Other aspects include patterning the first polymer layer. Yet further aspects include the first polymer layer including a polyimide. Aspects include forming a metal layer over the patterned first polymer layer; and patterning the metal layer. Other aspects include forming a second polymer layer over the metal layer; and curing the second polymer layer. Additional aspects include the metal layer including copper and the second polymer layer including a polyimide. Further aspects include patterning the second polymer layer. Yet other aspects include forming an under bump metallization (UBM) over the patterned second polymer layer; flipping the dies over 180 degrees; forming vias in the mold compound between the dies; forming metal in the vias; and forming and patterning a backside metal layer over the mold compound, vias and leadframe strip. Other aspects include forming and patterning a third polymer layer over the backside metal layer; forming ball grid array (BGA) pads over the patterned third polymer layer; applying solder balls to the UBM; applying solder balls to the BGA pads; attaching a printed circuit board to the solder balls applied to the UBM; and attaching packages to the solder balls applied to the BGA pads.

Another aspect of the present disclosure is a device including dies attached to a mold; a leadframe strip attached to the mold, wherein the leadframe strip includes etched and half etched portions positioned between each die; a mold cover formed over the mold and dies; and a mold compound formed in spaces between the dies and mold cover, wherein the etched portions of the leadframe strip contact the mold and mold cover.

Aspects include the mold compound being formed on upper surfaces of the half etched portion of the leadframe strip. Other aspects include the leadframe strip including a metal. Further aspects include the half-etched portions of the leadframe strip being adjacent to sides of the dies. Yet other aspects include the metal including copper or copper coated with a protective coating. Additional aspects include an active side of each die facing a surface of the mold.

According to the present disclosure some technical effects may also be achieved in part by a method including placing dies into a mold with an active side of each die facing a surface of the mold; placing a leadframe strip on the mold; placing a mold cover over the mold and dies; and adding polymer mold compound in spaces between the dies and mold cover, wherein the metal leadframe strip comprises etched and half etched portions positioned between each die and the half-etched portions of the metal leadframe strip are adjacent to sides of the dies.

Aspects include flipping the mold over 180 degrees; curing the mold compound; removing the cured mold compound containing the dies from the mold and mold cover, wherein the metal leadframe strip includes copper or copper coated with a protective coating.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of insufficient thermal transfer in wafer level packaging. In accordance with embodiments of the present disclosure, a leadframe strip is provided along the edges of the package to provide sufficient thermal transfer and prevent damage to the package and surrounding components.

Methodology in accordance with embodiments of the present disclosure includes placing dies into a mold with an active side of each die facing a surface of the mold; forming and etching a leadframe strip on the mold, wherein etched and half etched portions of the leadframe strip are formed between each die; placing a mold cover over the mold and dies; and adding mold compound in spaces between the dies and mold cover.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
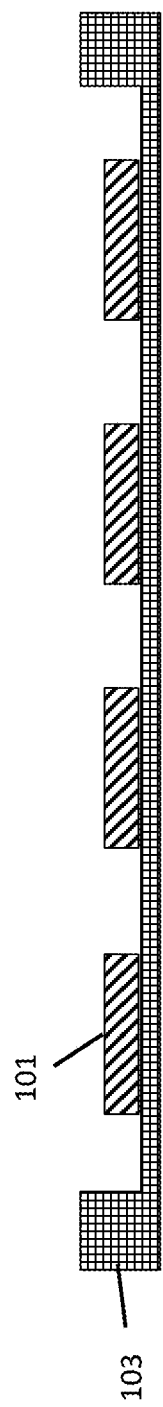
FIGS. 1A through 1Q schematically illustrate a semiconductor packaging process flow, in accordance with an exemplary embodiment.
Figure 1B:
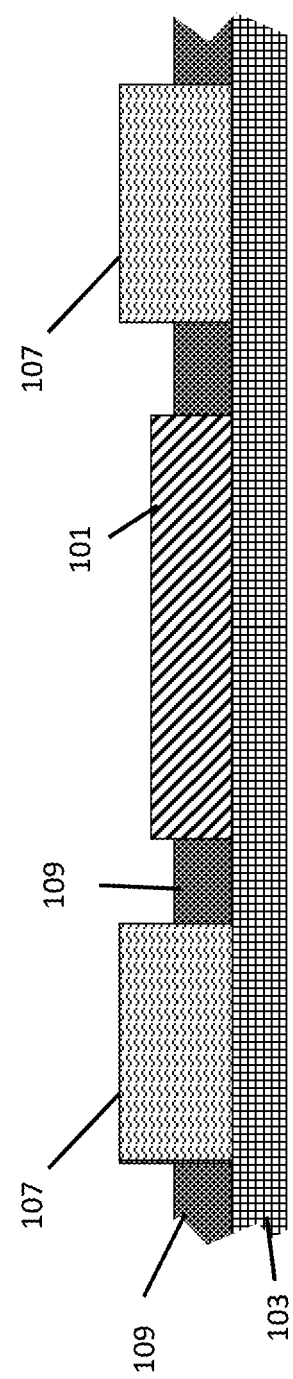

Adverting to FIG. 1A, individuals dies 101, which are from a fabricated wafer that has been thinned and diced, are placed on a mold 103. The dies 101 are placed and fixed to the mold with the active side of each die facing the mold 103 surface. Adverting to FIG. 1B, a cross sectional view of one of the dies 101 is illustrated with its active side facing the mold 103 surface. Prior to its placement on the mold 103, a leadframe strip is formed and etched in a separate manufacturing process. The leadframe strip is formed of two regions 107 and 109. Regions 107 of the leadframe are not subjected to etching and are full thickness regions. Regions 109 are half-etched regions. Leadframe regions 107 and 109 are composed of copper or other conductive metal. The conductive metal can be plated with a protective coating such as nickel. Upon completion of the leadframe regions 107 and 109, the completed leadframe strip is then placed onto the mold 103 such that the leadframe strip is positioned around the sides of the dies 101 in the mold 103.

FIG. 1C is a top view of the leadframe surrounding the dies 101 over the mold 103. As illustrated, regions 107 and 109 are present on sides of the dies 101 in an alternating pattern around the dies 101. In FIG. 1C, regions 107 are the full thickness regions of the leadframe regions and regions 109 are the half-etched regions of the leadframe.

Adverting to FIG. 1D, a mold compound 111 is dispensed over the mold and a mold cover 113 is placed over the mold 103 to allow for compression molding of the mold compound 111. Due to half-etched regions 109 of the leadframe, the mold compound 111 is permitted to flow across and between the dies 101. Regions 107 of the leadframe are of sufficient height to contact the mold cover, as shown in FIG. 1D. The mold compound can be organic filler and composed of silica. While compression molding is described, other molding technique for fan out WLSCP can be used.

Once the mold compound 111 is cured, the mold 103 and mold cover 113 are removed, and the dies 101 are flipped 180 degrees, as shown in FIG. 1E. Adverting to FIG. 1E, a polymer layer 117 is applied to the active side of each die 101. The first polymer layer 117 such as a polyimide is applied and cured to a thickness of approximately 5 to 10 microns. As shown in FIG. 1F, the first polymer layer 117 is exposed and developed to form a pattern. Adverting to FIG. 1G, a metal layer 119, for example a copper layer, is deposited and patterned over the polymer layer 117. The metal layer 119 serves as a redistribution layer (RDL) to make 110 pads available. In FIG. 1H, a second polymer layer 121 is deposited and cured over the metal layer 119 to a thickness of approximately 5 to 10 microns. The second polymer layer 121 can be a polyimide as with the first polymer layer 117. Adverting to FIG. 1I, the second polymer layer 121 is exposed and developed to form openings 123 down to the metal layer 119.

Figure 1L:
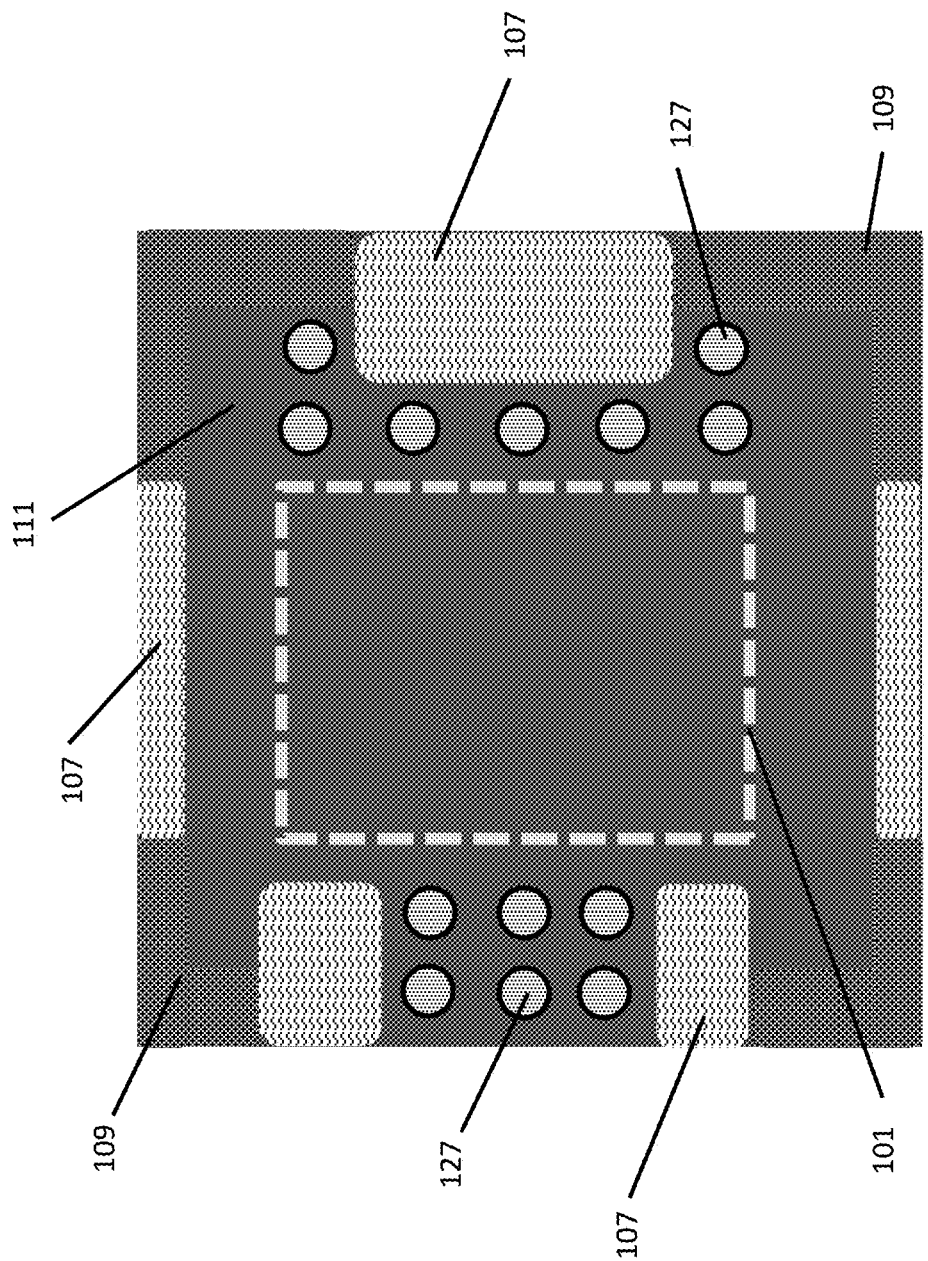
Figure 1M:
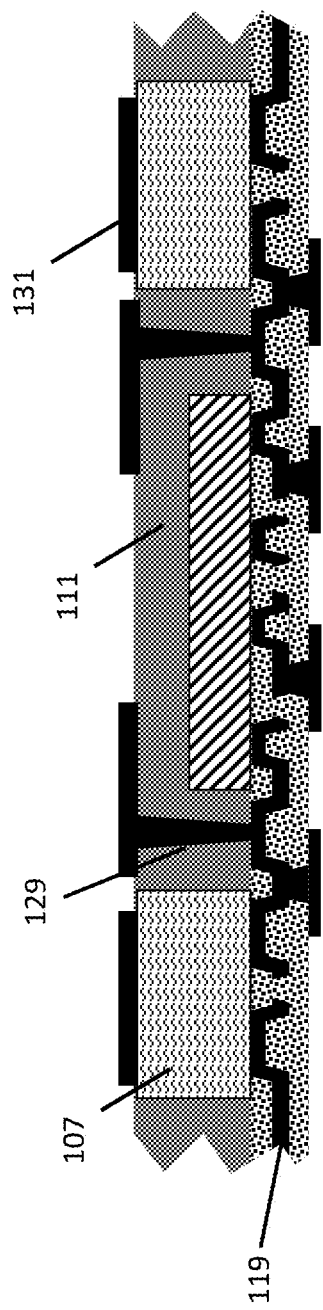

Adverting to FIG. 1J, a plurality of UBMs 125 are formed in the opening 123 and over the second polymer layer 121. As shown in FIG. 1K, the dies 101 are flipped over 180 degrees, and TMVs 127 are formed in the mold compound 111 down to the metal layer 119. FIG. 1L is a top view of the packaging which illustrates TMVs 127 formed in the mold compound 111 on sides of each die 101. In FIG. 1M, metal 129 is filled in the TMVs 127, and backside metal layer 131 is formed and patterned over the mold compound 111, metal filled TMVs 127 and regions 107 of the leadframe strip.

Figure 1Q:
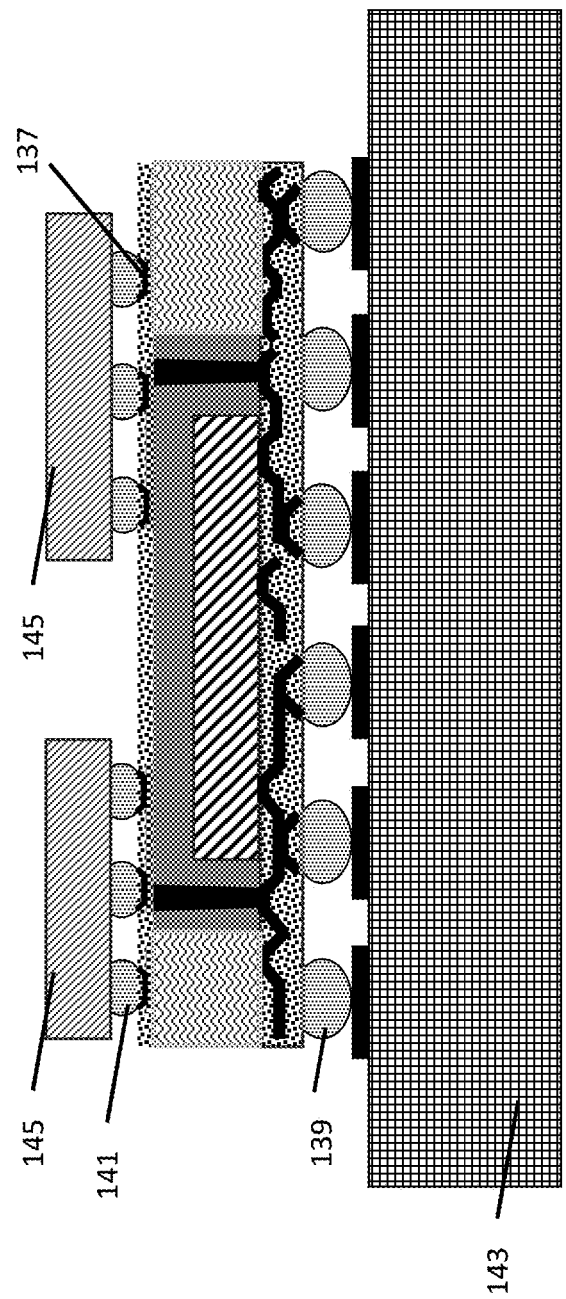

Adverting to FIG. 1N, a third polymer layer is formed, exposed and developed over and between openings 135 in the backside metal layer 131. In FIG. 1O, BGA pads 137 are formed over the patterned third polymer layer 133 and in the openings 135 of the third polymer layer 133. As shown in FIG. 1P, solder balls 139 are applied to the UBMs 125. In FIG. 1Q, solder balls 141 are applied to the BGA pads 137. A PCB or motherboard 143 is applied to the solder balls 139 applied to the UBMs 125. Top chip packages 145 are attached to the solder balls 141 applied to the BGA pads 137.

The embodiments of the present disclosure can achieve several technical effects, including improved heat transfer between chips/packages joined to the top of the 3D WLCSP package and the PCB. The embodiments of the present disclosure can permit additional RF integrations, such as filters added to radiofrequency-silicon on insulator (RF- SOI) power amplifiers (PA). Embodiments of the present disclosure help reduce costs in 3D WLCSP, as compared to 3D through silicon vias (TSV), especially in the RF field where 110 requirements are relatively low. Improving the heat transfer with the present embodiments can expand the application space. Leadframe strips of the present embodiments provide a low-cost technology for wirebond quad-flat no-leads (QFN) and quad flat package (QFP) and are well suited for strip based integration. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
dies attached to a mold;
a leadframe strip attached to the mold, wherein the leadframe strip includes etched and half etched portions positioned between each die;
a mold cover formed over the mold and dies; and
a mold compound formed in spaces between the dies and mold cover,
wherein the etched portions of the leadframe strip contact the mold and mold cover, and
wherein a height of the etched portions of the leadframe strip is higher than a height of each die, and an interface of the mold and mold cover is coplanar to a top surface of the leadframe strip on opposite side of the active side.

2. The device according to claim 1, wherein the mold compound is formed on upper surfaces of the half etched portion of the leadframe strip.

3. The device according to claim 1, wherein the leadframe strip comprises a metal.

4. The device according to claim 3, wherein the half-etched portions of the leadframe strip are adjacent to sides of the dies.

5. The device according to claim 3, wherein the metal comprises copper.

6. The device according to claim 3, wherein the metal comprises copper coated with a protective coating.

7. The device according to claim 1, wherein an active side of each die faces a surface of the mold.

8. A device comprising:
dies attached to a mold;
a leadframe strip attached to the mold, wherein the leadframe strip includes etched and half etched portions positioned between each die;
a mold cover formed over the mold and dies, wherein the etched portions of the leadframe strip are of sufficient height to contact the mold cover; and
a mold compound formed in spaces between the dies and mold cover,
wherein a height of the etched portions of the leadframe strip is higher than a height of each die, and an interface of the mold and mold cover is coplanar to a top surface of the leadframe strip on opposite side of the active side.

9. The device according to claim 8, wherein the mold compound is formed on upper surfaces of the half etched portion of the leadframe strip.

10. The device according to claim 8, wherein the leadframe strip comprises a metal.

11. The device according to claim 10, wherein the half-etched portions of the leadframe strip are adjacent to sides of the dies.

12. The device according to claim 10, wherein the metal comprises copper.

13. The device according to claim 10, wherein the metal comprises copper coated with a protective coating.

14. The device according to claim 8, wherein an active side of each die faces a surface of the mold.

15. A device comprising:
dies formed into a mold with an active side of each die facing a surface of the mold;
a leadframe strip formed on the mold;
a mold cover formed over the mold and dies; and
a polymer mold compound formed in spaces between the dies and mold cover,
wherein the metal leadframe strip comprises etched and half etched portions positioned between each die and the half-etched portions of the metal leadframe strip are adjacent to sides of the dies, and
wherein a height of the etched portions of the leadframe strip is higher than a height of each die, and an interface of the mold and mold cover is coplanar to a top surface of the leadframe strip on opposite side of the active side.

16. The device according to claim 15, wherein the metal leadframe strip comprises copper.

17. The device according to claim 15, wherein the leadframe strip comprises a metal.

18. The device according to claim 17, wherein the metal leadframe strip comprises copper coated with a protective coating.

19. The device according to claim 18, wherein the protective coating comprises nickel.

20. The device according to claim 17, wherein the etched portions of the leadframe strip contact the mold and mold cover.

* * * * *